United States Patent
Cappelletti

(10) Patent No.: US 6,841,445 B2
(45) Date of Patent: Jan. 11, 2005

(54) METHOD OF MAKING FLOATING GATE NON-VOLATILE MEMORY CELL WITH LOW ERASING VOLTAGE HAVING DOUBLE LAYER GATE DIELECTRIC

(75) Inventor: Paolo Cappelletti, Seveso (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/792,308

(22) Filed: Mar. 3, 2004

(65) Prior Publication Data

US 2004/0173840 A1 Sep. 9, 2004

Related U.S. Application Data

(62) Division of application No. 10/158,706, filed on May 30, 2002, now Pat. No. 6,710,394, which is a division of application No. 09/521,876, filed on Mar. 8, 2000, now Pat. No. 6,399,444, which is a division of application No. 08/940,856, filed on Sep. 29, 1997, now Pat. No. 6,054,731.

(30) Foreign Application Priority Data

Sep. 30, 1996 (EP) ............................................ 96830493

(51) Int. Cl.$^7$ ............................................ H01L 21/336
(52) U.S. Cl. ...................................... 438/257; 438/263
(58) Field of Search ................................ 438/257–265; 257/314–324

(56) References Cited

U.S. PATENT DOCUMENTS

| | | | |
|---|---|---|---|
| 4,099,196 A | 7/1978 | Simko | 357/23 |
| 4,314,265 A | 2/1982 | Simko | 357/23 |
| 5,278,440 A | 1/1994 | Shimoji | 257/324 |
| 5,389,808 A | 2/1995 | Arai | 257/316 |
| 5,420,845 A | 5/1995 | Maeda et al. | 369/100 |
| 5,429,965 A | 7/1995 | Shimoji | 437/43 |
| 5,496,753 A | 3/1996 | Sakurai et al. | 437/43 |
| 5,504,022 A | 4/1996 | Nakanishi et al. | 437/43 |
| 5,511,020 A | 4/1996 | Hu et al. | 365/185.28 |
| 5,596,214 A | 1/1997 | Endo | 257/324 |
| 5,640,345 A | 6/1997 | Okuda et al. | 365/184 |
| 5,670,790 A | 9/1997 | Katoh et al. | 257/14 |
| 5,801,401 A | 9/1998 | Forbes | 257/77 |
| 5,886,368 A | 3/1999 | Forbes et al. | 257/77 |
| 5,966,603 A | 10/1999 | Eitan | 438/258 |
| 6,023,079 A * | 2/2000 | Hida | 257/316 |
| 6,054,731 A | 4/2000 | Cappelletti | 257/314 |
| 6,147,380 A | 11/2000 | Cappelletti | 257/317 |

FOREIGN PATENT DOCUMENTS

| | | | | |
|---|---|---|---|---|
| EP | 0 560 435 A2 | 9/1993 | | H01L/21/28 |
| EP | 0 681 333 A1 | 11/1995 | | H01L/29/78 |
| FR | 2 533 740 | 3/1984 | | G11C/17/00 |
| JP | 60-189972 | 9/1985 | | H01L/29/78 |
| JP | 61-001056 | 7/1986 | | H01L/29/78 |
| JP | 5-75135 | 3/1993 | | H01L/29/788 |

* cited by examiner

*Primary Examiner*—Cuong Nguyen
(74) *Attorney, Agent, or Firm*—Allen, Dyer, Doppelt, Milbrath & Gilchrist, P.A.

(57) ABSTRACT

A non-volatile memory cell of the type which includes at least one floating gate transistor and which is realized over a semiconductor substrate includes a source region, and a drain region, separated by a channel region which is overlaid by a thin layer of gate oxide. The gate oxide isolates a floating gate region from the substrate. The floating gate region is coupled to a control gate terminal. The floating gate region of the memory cell develops a first potential barrier between the semiconductor substrate and the gate oxide layer, and a second different potential barrier between the floating gate region and the gate oxide.

4 Claims, 4 Drawing Sheets

METHOD OF MAKING FLOATING GATE NON-VOLATILE MEMORY CELL WITH LOW ERASING VOLTAGE HAVING DOUBLE LAYER GATE DIELECTRIC

This application is a divisional of Ser. No. 10/158,706 filed May 30, 2002 now U.S. Pat. No. 6,710,394 which is a divisional of Ser. No. 09/521,876 filed Mar. 8, 2000, now U.S. Pat. No. 6,399,444, which is a divisional of Ser. No. 08/940,856 filed Sep. 29, 1997, now U.S. Pat. No. 6,054,731, the disclosures of which are hereby incorporated by reference in their entirety.

FIELD OF THE INVENTION

This invention relates to a low erase voltage, floating gate non-volatile memory cell. The invention also concerns a method of making a low erase voltage memory cell. Specifically, the invention relates to a non-volatile memory cell of the type which comprises at least one floating gate transistor realized over a semiconductor substrate, with a source region and a drain region separated by a channel region which, in turn, is overlaid by a thin layer of gate oxide to isolate from the substrate a floating gate region coupled to a control gate terminal. The invention relates, particularly, but not exclusively, to a memory cell comprising a single transistor and intended for storage devices of the FLASH type, and the description herein below deals with this particular application for convenience of illustration only.

BACKGROUND OF THE INVENTION

As is well known, memory cells having a single floating gate transistor are most widely utilized in FLASH memories. To better illustrate the invention aspects, a conventional type of memory cell, as schematically shown in FIG. 1, will be considered first. Such a cell 1 comprises a MOS transistor 2 which is realized over a semiconductor substrate 3 and has a source region S, and a drain region D separated by a channel region C which, in turn, has a control gate terminal GC realized thereover. This is, therefore, a transistor of the NMOS type wherein a second gate GF, referred to as the floating gate on account of it being fully enveloped in a dielectric material, is also provided between the control gate GC and the substrate 3. In particular, the floating gate GF is separated from the control gate GC by a layer 4, referred to as the interpoly dielectric layer. A thin layer 5 of silicon oxide, referred to as the gate oxide layer, is interposed between the floating gate GF and the substrate 3.

Thus, the floating gate GF cannot be accessed from outside, and its potential will only depend on any charge which may be present thereon and on the capacitive couplings with the other elements of the cell. Accordingly, such a cell forms basically a data storage element based on charges becoming trapped on the floating gate GF. Major advantages of a floating gate memory cell are: its compact size, low sensitivity to disturbances during the programming step, and low voltage requirements during the reading step, that is, for both the programming operations and the cell erasing.

Such a memory cell 1 is usually programmed by hot electron injection and erased by a tunneling effect. The programming operation of a memory cell such as the cell 1 uses the generation of channel hot electrons in the drain region D (or rather, in an area of spatial charge thereof known as the pinch-off area). Through the application of a favorable electric field, i.e., a field which enables a certain number of electrons of the drain region D to acquire sufficient energy to overcome the potential barrier between the drain region and the gate oxide, charges are caused to migrate toward the floating gate GF. The floating gate GF will store an essentially negative charge.

In a dual mode, for the erasing operation, which allows electrons to be extracted from the floating gate GF of the memory cell 1, the tunneling effect is utilized, also referred to as Fowler-Nordheim's effect. In particular, current programming techniques provide for the erasing to be carried out by applying a high voltage to the source region S, this operation being commonly referred to as source erasing. Under these conditions, the shape of the source junction should be a gradual one, so that the substrate current can be lowered and the risk of creating hot holes reduced.

The need for a gradual source junction shape represents, however, one of the strictest limitations imposed on the scalability of the gate length of a memory cell so realized. A first known approach for overcoming this limitation is to perform the operation of erasing of the memory cell 1 by a so-called channel erasing. In this case, the memory cell 1 is erased by applying a negative voltage to the control gate GC of the transistor 2, while holding the source S and drain D regions at the same potential as the semiconductor substrate 3.

Channel erasing mitigates the limitations on the length scalability of the cell 1, thereby removing the need for a particular shape of the source junction. While being in many ways advantageous, this first discussed approach has a major drawback in that it involves the application of high erase voltages to the control gate GC, due to the high capacitive coupling between the channel and the floating gate. In fact, while for source erasing an erase voltage of 10 to 12 volts is adequate, channel erasing requires a voltage of 17 to 20 volts. Such a high voltage value is, however, incompatible with advanced CMOS processes for manufacturing semiconductor devices.

To address this problem, it has been prior practice to locate the storage device in a diffusion well of the P-well type, isolated from the substrate 3, using a triple-well CMOS process. In this way, positive voltages can be applied to the substrate 3 and the source and drain regions of the memory cell during the erasing operation, so as to split the voltage between the negatively biased control gate GC and the positively biased substrate 3. This would, accordingly, restrict the absolute value of the erase voltage needed.

With a view to obtaining a scalability for the length of the cell 1 it is necessary, however, to concurrently raise the inherent threshold voltage to Vt0 of the memory cell 1 so as to attenuate the effects of a possible shorting of the channel region C (punch-through, drain-turn-on). The inherent threshold voltage Vt0 of the memory cell depends on the characteristics of the cell construction (such as the thickness of the gate oxide 5 or the capacitive ratios) and the dopant concentration in the channel region C.

The erase voltage required to have the cell erased within a predetermined time, usually set by the storage device specifications, will be higher, the higher the inherent threshold voltage Vt0 of the cell. In fact, the threshold voltage Vt of the cell depends on the charge Q stored in the floating gate GF, and the inherent threshold voltage Vt0 of the cell (that is, when it has no charge in the floating gate), according to the following relationship:

$$Vt = Vt0 - Q/Cpp$$

being the coupling capacitance between the floating gate GF and the control gate GC.

In addition, for the memory reading operations to be carried out properly, it is necessary for the threshold voltages of the memory cells to acquire suitable values, regardless of their inherent threshold voltage Vt0.

In particular, memory cells containing a logic state "1" should have a threshold voltage typically within the range of 0.5V to 3V, whereas memory cells containing a logic state "0" should have a threshold voltage typically above 5V.

As for memory cells of the FLASH type, current manufacturing processes provide for inherent threshold voltages between 2V and 3V. Thus, erased cells (i.e. cells with a logic state "1") will have a threshold voltage Vt close to their inherent threshold voltage Vt0, or in other words, have a reduced number of charges on the floating gate GF, whereas programmed cells (i.e. cells with a logic state "0") will show a threshold voltage Vt which is definitely higher than their inherent threshold voltage Vt0. In this context, the erasing operation includes extracting the negative charge stored in the floating gate GF of the programmed cells until it is restored to a condition of near-neutral charge.

In addition, the presence of charge in large amounts in the floating gate of the programmed cells contributes to an increased electric field in the gate oxide during erasing. As mentioned above, to obtain a scalability for the length of the cell 1, the dopant concentration in the channel region C must be increased so as to attenuate the punch-through and drain-turn-on effects. In this way, memory cells can be obtained which are scaled with inherent threshold voltages Vt0 of 4 to 6 volts.

However, such cells are in a near-neutral charge condition in the programmed state of "0", and have a high positive charge in the floating gate GF when in the erased state. This positive charge lowers the electric field in the channel oxide during the erasing operation and enforces the application of higher erase voltages. Thus it occurs that, while a negative erase voltage of 17–20V must be applied to the gate of a cell having an inherent threshold voltage Vt0 of 2–3V, in order to erase a memory cell with an inherent threshold voltage of 4–6V, a negative erase voltage of 20–24V must be provided. The need for scaling the cell length would, therefore, lead to the use of high erase voltages, which clashes with advanced CMOS processes that have a limited capability to handle high voltages.

SUMMARY OF THE INVENTION

In view of the foregoing background it is therefore an object of the invention to provide a scalable memory cell of the FLASH type, in particular one comprising a single floating gate transistor, which has such construction and performance characteristics to permit a reduced erase voltage.

The idea of solution on which the instant invention stands is to provide a memory cell which has an asymmetrical potential barrier between the substrate, gate oxide and floating gate region, to thereby facilitate the erasing operation without impairing the retention of data into the memory. Based on this idea of solution, the technical problem is solved by a memory cells as previously indicated and defined in the characterizing portion of claim 1. The technical problem is also solved by a method of manufacturing a memory cell as previously indicated and defined in the characterizing portion of claim 10.

BRIEF DESCRIPTION OF THE DRAWINGS

The features and advantages of a memory cell according to the invention will be apparent from the following description of embodiments thereof, given by way of example and not of limitation with reference to the accompanying drawings. In the drawings.

DETAILED DESCRIPTION OF THE PREFERRED EMBODIMENTS

Figure 1:
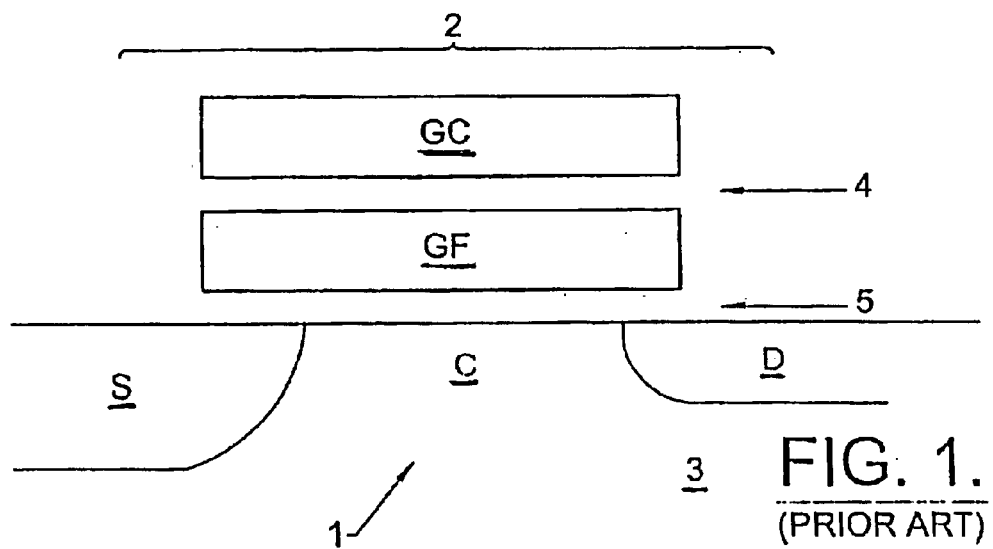
FIG. 1 shows schematically a single-transistor memory cell according to the prior art.

Referring to the drawing figures, generally and schematically shown at 10 is a memory cell according to the invention. It should be emphasized that, whereas non-scalable cells according to the prior art have a logic state "1" which is characterized by neutral charge, and a logic state "0" characterized by the presence of negative charge on the floating gate GF, with conventional cells of the scalable type, the logic state "1" corresponds to the presence of positive charge on the floating gate GF, and the logic state "0" corresponds to a near-neutral charge condition. The gate oxide 5 of these cells should allow charge to be flowed by a high electric field being applied during the erasing operation, while ensuring retention of data stored in the memory. In other words, the gate oxide 5 of a memory cell, such as the cell 1 shown in FIG. 1, should exhibit a very small leakage current in the presence of reduced electric fields, that is, during the reading operation or in a stand-by condition. In the latter case, the electric field would correspond to the internal electric field developed by the charge stored in the floating gate.

Figure 2:
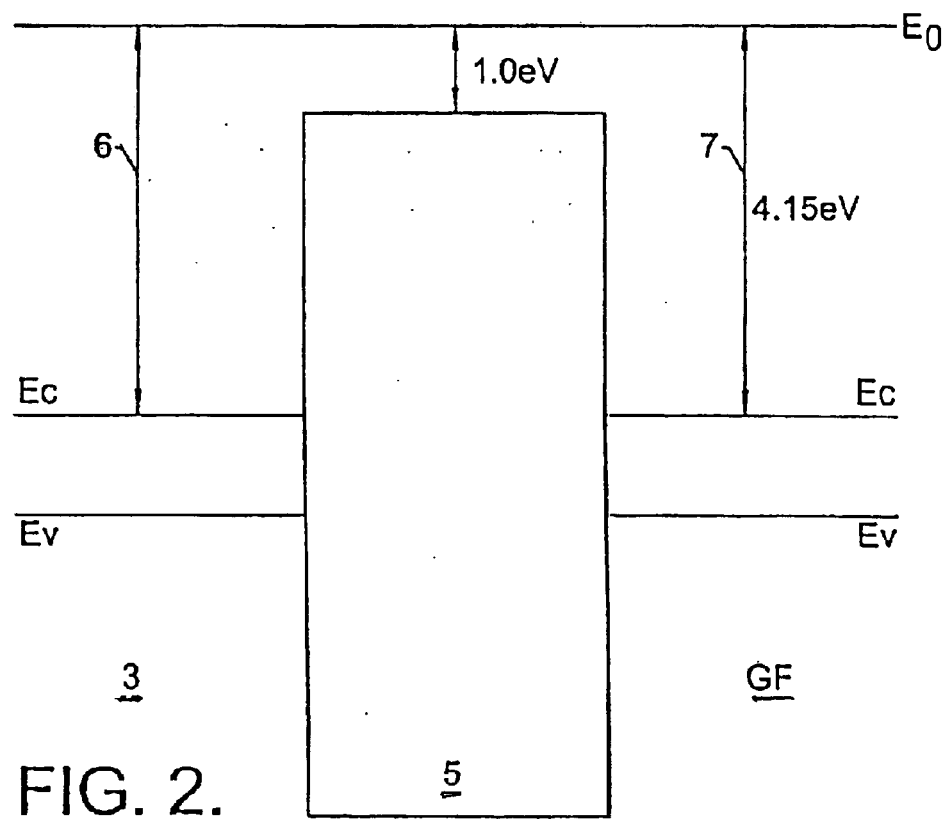
FIG. 2 shows schematically symmetrical potential barriers between the substrate/gate oxide/floating gate junctions of the cell in FIG. 1.

Shown schematically in FIG. 2 are first 6 and second 7 potential barriers occurring in the memory cell 1 according to the prior art. In particular, there may occur two different situations, as specified below. With a conventional non-scalable cell type, where in the charge stored on the floating gate is almost nil (in the logic state "1") or even negative (in the logic state "0"), the retention of data in the memory during an erasing operation is ensured by the first potential barrier 6 provided between the substrate 3 and the gate oxide 5. This first potential barrier 6, in fact, will resist the injection of electrons into the floating gate GF of the cell during the reading step. This phenomenon is referred to as charge gain.

Likewise in the stand-by condition, this retention in the memory is ensured by the second potential barrier 7 provided between the floating gate GF and the gate oxide 5. The second barrier 7 will resist the leakage of electrons from the floating gate GF. This phenomenon is referred to as charge loss, by analogy with the former. Under such conditions, it is convenient if a memory cell is provided which has the first 6 and second 7 potential barriers substantially identical with each other.

To achieve this, a semiconductor/gate oxide/floating gate structure should be arranged to have a substantially symmetrical band pattern. Such a cell has the same resistance to the electrons flow from the substrate 3 to the floating gate GF as from the floating gate GF to the substrate 3. It should be considered that this concerns the electrons, not the holes, since the contribution of holes to the gate current is negligible. On the other hand, with cells of the scalable type, for which the charge stored on the floating gate GF is almost nil (in the logic state "0") or even positive (in the logic state "1"), it is only the first potential barrier 6 between the substrate 3 and the gate oxide 5 that plays a deciding role for a correct retention of data stored in the memory during the reading operations or in the stand-by condition.

Figure 3:
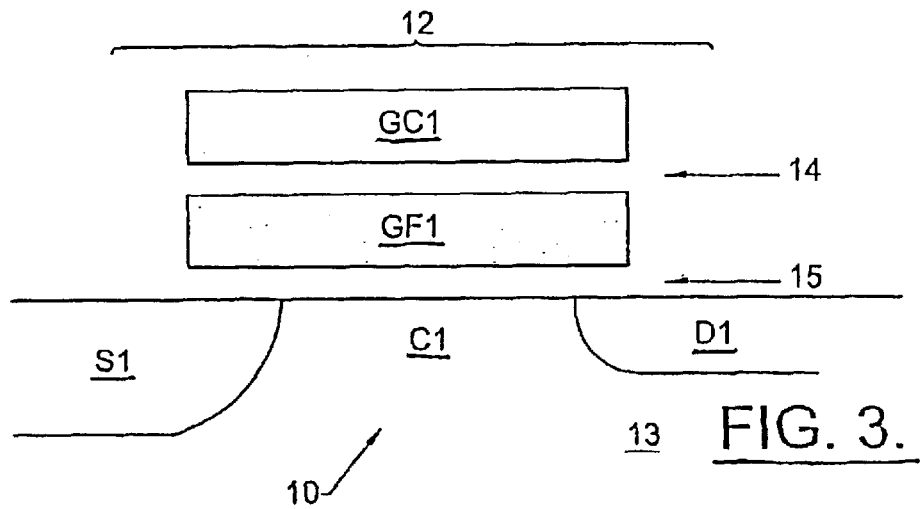
FIG. 3 shows schematically a single-transistor memory cell according to this invention.

The Memory cell 10 of this invention is a cell comprising a single floating gate transistor, which is structurally similar to the conventional cell 1 of FIG. 1. This cell 10, shown schematically in FIG. 3, comprises a floating gate transistor 12 realized over a semiconductor substrate 13 with a source region S1 and a drain region D1 separated by a channel region C1 overlaid by a thin layer 15 of gate oxide which isolates, from the substrate 13, a floating gate region GF1 coupled to a control gate terminal GC1.

In the light of the above considerations, a method is proposed of manufacturing a memory cell 10 of the low erase voltage non-volatile type, whereby a first potential barrier 16 is provided between the semiconductor substrate 13 and the layer 15 of gate oxide, and a second different potential barrier 17 is provided between the floating gate region GF1 and the layer 15 of gate oxide. In particular, the method of this invention provides for the second potential barrier 17 to be lower than the first potential barrier 16, thereby permitting the use of a lower erase voltage Ver and ensuring the retention of any data stored in the memory cell 10. Modified embodiments of the memory cell 10 according to the invention will now be described which have asymmetrical potential barriers between the substrate/gate oxide/floating gate junctions. In particular, examples of memory cells having asymmetrical potential barriers will be described, which are based essentially on three embodiments of the invention.

Embodiment 1

Figure 4:
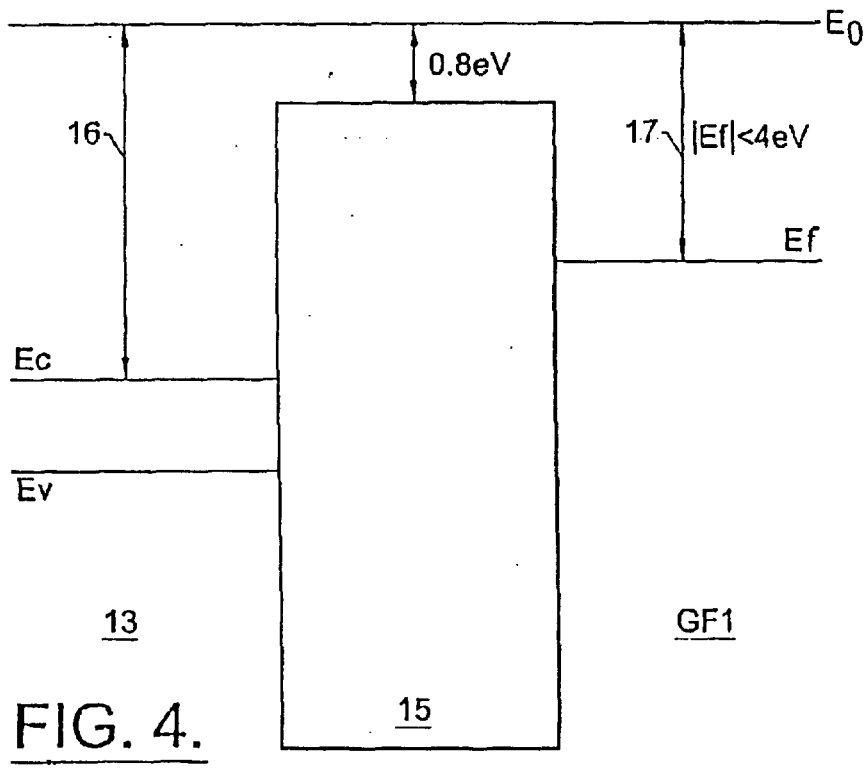
FIG. 4 shows schematically asymmetrical potential barriers between the substrate/gate oxide/floating gate junctions of a first embodiment of the memory cell according to this invention.

Shown in FIG. 4 are the first 16 and second 17 potential barriers, being asymmetrical relative to each other and associated with the memory cell 10 of this invention. A first manner of obtaining such first 16 and second 17 potential barriers is based on a selection of a suitable material for forming th floating gate region GF1. In prior memory cells, the material used has been polycrystalline silicon which, having the same electron affinity as the silicon included in the substrate 3, provides a first 6 and a second 7 potential barrier, identical with each other, as explained in connection with FIG. 2.

To provide asymmetrical barriers 16 and 17, a material must be used instead which has a lower electron affinity (or work function, in the instance of metals) than silicon. Particularly effective, for the purpose of limiting the erase voltage Ver to be applied to the memory cell 10, are materials whose electron affinity lies between 2.5 eV and 3.5 eV, and which can provide potential barriers in excess of 1.7 eV, i.e., appropriate to secure the data stored in the memory, while reducing the electric field required for the erasing operations. Advantageously, this first embodiment of the memory cell 10, according to the invention, is essentially characterized by a very simple implementation.

Embodiment 2

Figure 5:
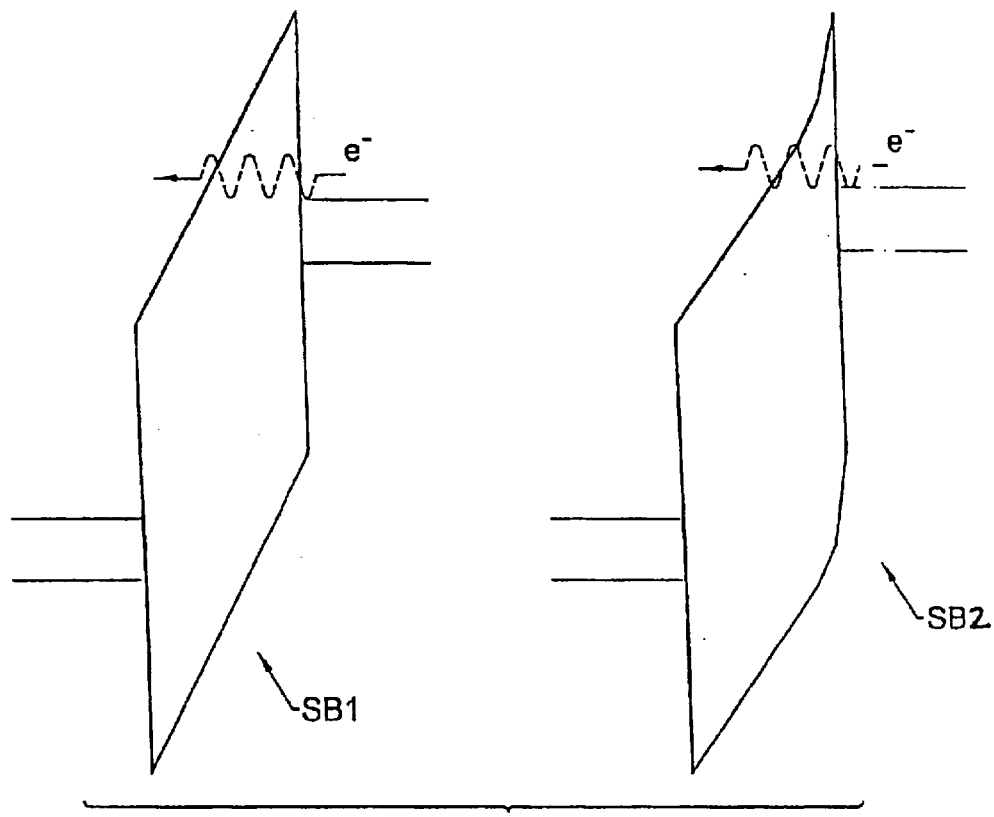
FIG. 5 shows erase band patterns for conventional memory cells and for a second embodiment of the memory cell according to this invention.

A second way of implementing the memory cell 10 showing asymmetry in the conduction of current through the gate oxide provides for the electric field to be focused onto the surface of the floating gate GF1. This focusing can be obtained through the so-called point effect. FIG. 5 shows an erase band pattern SB1 of the memory cell 1 according to the prior art, and an erase band pattern SB2 for a second embodiment of the inventive memory cell 10. It also illustrates schematically the electric field focusing effect for the band pattern SB2.

The operation of the second embodiment of the memory cell 10 according to the invention will now be explained. As a result of the focusing effect, the erase voltage Ver is increased due to the increased local electric field. The same result may also be obtained with floating gates implemented by polycrystalline silicon, the height of the barriers of potential remaining the same as in the prior art.

Figure 6A:
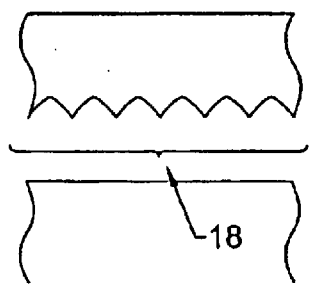
FIGS. 6A, 6B and 6C show schematically the floating gate surface of different examples of the second embodiment of the memory cell according to this invention.
Figure 6B:
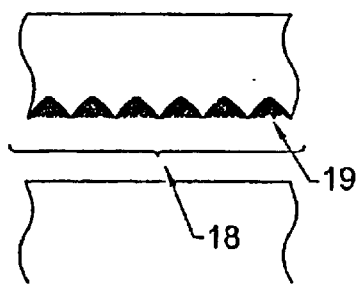

In particular, the electric field focusing effect can be obtained by physically providing a plurality of points 18 on the surface of the floating gate GF1 in the direction toward the gate oxide 15. A first method for obtaining this plurality of points 18 comprises chemi-physical techniques of etching away the gate oxide layer 15 prior to depositing the polycrystalline silicon, as shown schematically in FIG. 6A. A second method provides instead for the deposition of a thin dielectric layer 19 onto the surface of the gate oxide layer 15, thereby to bring about a nucleation effective to break the continuity of the dielectric layer wherever the polycrystalline silicon layer will then be deposited, as shown schematically in FIG. 5B.

Figure 6C:
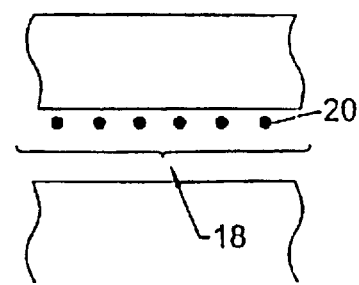

Finally, a third method includes introducing granules 20 of a conductive material into the gate oxide layer 15, in the vicinity of the floating gate region GF1, as shown schematically in FIG. 6C. These granules may be introduced, for example, by a low-energy implantation of silicon (or another suitable material) in the gate oxide layer 15, followed by a thermal treatment of the memory cell 10 to precipitate the implanted silicon, thereby forming the granules 20. Alternatively, a thin layer of polycrystalline silicon could be deposited, followed by oxidation, such that residual silicon granules not fully oxidized can later be isolated using, of preference, a grain-edge oxidation process.

Embodiment 3

Figure 7:
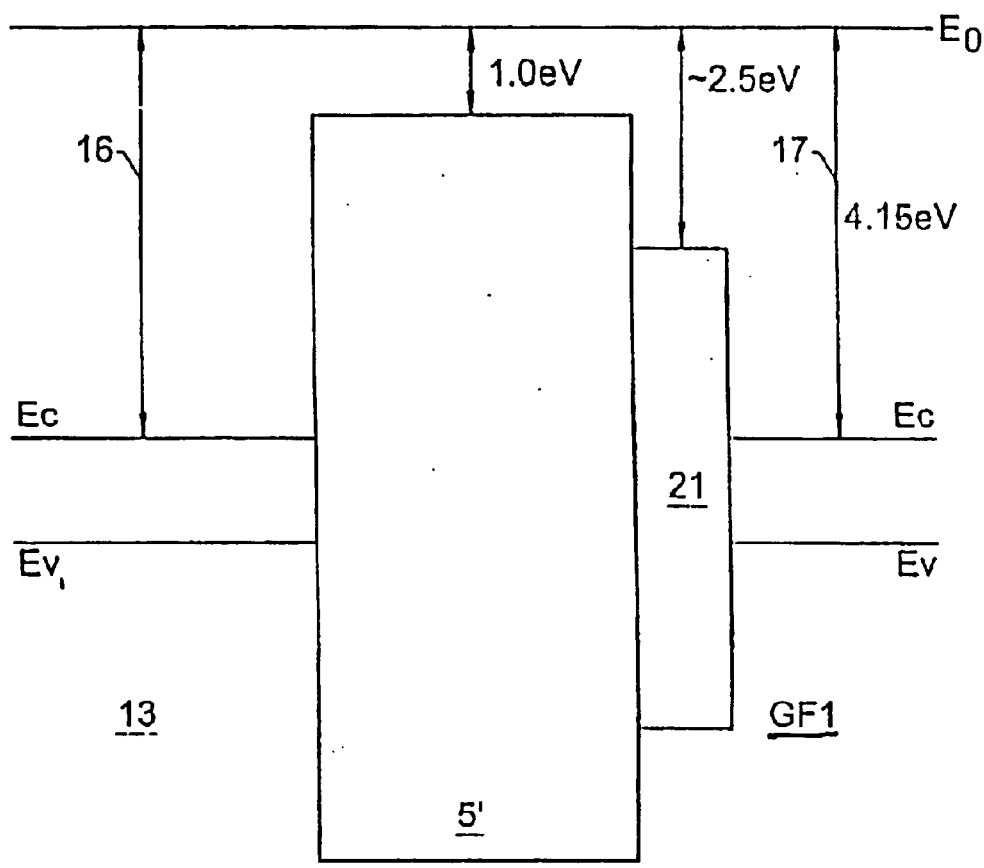
FIG. 7 shows schematically asymmetrical potential barriers between the substrate/gate oxide/floating gate junctions of a third embodiment of the memory cell according to this invention.

A third way of implementing the memory cell 10 having asymmetrical potential barriers, according to the invention, is to deposit a double layer as the gate dielectric. The double layer includes a first layer 5' of silicon oxide at the substrate 13 surface, and a second layer 21 of a suitable dielectric material whose electron affinity lies intermediate to those of the silicon oxide and the polycrystalline silicon of the floating gate GF1, as shown schematically in FIG. 7. Advantageously, two or more of the above methods can be used in combination, with this invention.

In a preferred embodiment of the memory cell 10 of this invention, the gate oxide layer 15 is realized using silicon nitride. Silicon nitride is a dielectric material which has a higher electron affinity than silicon oxide (a prerequisite of the third embodiment); in addition, it lends itself for use in combination with a layer of silicon oxide. In this case, it is desirable that the layer of silicon nitride be a relatively thin one, to avoid undesired effects of charge build-up at the interface between the silicon oxide and nitride. Also known is that a deposition of silicon nitride at a low temperature results in nucleation of silicon precipitates within the nitride matrix. Such deposition would, therefore, enable the formation of focusing spots as explained in connection with the second embodiment of the invention. In this case, a combination of the second and the third embodiment would be provided.

That which is claimed is:

1. A method for making a floating gate transistor for a memory cell of a non-volatile memory on a semiconductor substrate, the method comprising the steps of:

forming a gate oxide layer on the substrate and forming a floating gate region on the gate oxide layer by forming a first layer of material of a first type adjacent to the surface of the semiconductor substrate and forming a second layer of material of a second type whose electron affinity lies intermediate to those of the first layer and the floating gate region for developing a first potential barrier between the semiconductor substrate and the gate oxide layer and for developing a second different potential barrier between the floating gate region and the gate oxide layer.

2. A method according to claim 1, and further comprising the step of forming the second layer as a silicon nitride layer.

3. A method according to claim 1, and further comprising the step of forming the second layer at a thickness less than a thickness of said first layer.

4. A method according to claim 1, and further comprising the step of depositing the second layer at a low temperature.

* * * * *